United States Patent
Han et al.

(10) Patent No.: US 8,609,525 B2
(45) Date of Patent: Dec. 17, 2013

(54) INTEGRATED CIRCUIT PACKAGING SYSTEM WITH INTERCONNECTS AND METHOD OF MANUFACTURE THEREOF

(75) Inventors: BongHwan Han, Icheon (KR); Tae Kyu Choi, Icheon (KR); SeungJoo Kwak, Hwasung (KR); DongWon Son, Icheon (KR); Gyung Sik Yun, Young-in (KR)

(73) Assignee: STATS ChipPAC Ltd., Singapore (SG)

( * ) Notice: Subject to any disclaimer, the term of this patent is extended or adjusted under 35 U.S.C. 154(b) by 235 days.

(21) Appl. No.: 13/053,142

(22) Filed: Mar. 21, 2011

(65) Prior Publication Data

US 2012/0241964 A1 Sep. 27, 2012

(51) Int. Cl.
*H01L 21/44* (2006.01)
*H01L 23/48* (2006.01)

(52) U.S. Cl.
USPC ........... 438/613; 438/617; 257/737; 257/784; 257/E23.024; 257/E21.504

(58) Field of Classification Search
USPC .......... 257/784, 737, 666, E23.024, E21.509; 438/613, 617
See application file for complete search history.

(56) References Cited

U.S. PATENT DOCUMENTS

| | | | | |
|---|---|---|---|---|
| 4,486,945 A * | 12/1984 | Aigoo | ........................... | 438/123 |
| 5,328,079 A * | 7/1994 | Mathew et al. | ............ | 228/180.5 |
| 5,656,830 A * | 8/1997 | Zechman | ...................... | 257/784 |
| 5,842,628 A * | 12/1998 | Nomoto et al. | ............ | 228/180.5 |
| 6,420,256 B1 * | 7/2002 | Ball | .............................. | 438/613 |
| 6,561,411 B2 * | 5/2003 | Lee | .............................. | 228/180.5 |
| 6,787,926 B2 * | 9/2004 | Chen et al. | .................... | 257/784 |
| 7,067,413 B2 | 6/2006 | Kim et al. | | |
| 7,176,570 B2 * | 2/2007 | Takahashi | ..................... | 257/737 |
| 7,347,352 B2 * | 3/2008 | Qin et al. | .................... | 228/180.5 |
| 7,475,802 B2 | 1/2009 | Yajima | | |
| 7,584,881 B2 * | 9/2009 | Qin et al. | .................... | 228/180.5 |
| 7,821,140 B2 * | 10/2010 | Mii et al. | ...................... | 257/784 |
| 8,129,263 B2 * | 3/2012 | Lee et al. | ...................... | 438/617 |
| 2003/0166333 A1 * | 9/2003 | Takahashi | ..................... | 438/617 |
| 2004/0152292 A1 * | 8/2004 | Babinetz et al. | ............ | 438/617 |
| 2005/0072833 A1 * | 4/2005 | Wong et al. | ................ | 228/180.5 |
| 2008/0111252 A1 * | 5/2008 | Qin et al. | ...................... | 257/784 |
| 2009/0014850 A1 * | 1/2009 | Craig et al. | ................... | 257/673 |
| 2009/0321927 A1 * | 12/2009 | Nishimura et al. | .......... | 257/737 |

\* cited by examiner

*Primary Examiner* — Nitin Parekh

(74) *Attorney, Agent, or Firm* — Ishimaru & Associates LLP; Chang John Yang

(57) ABSTRACT

A method of manufacture of an integrated circuit packaging system includes: providing a package carrier having a carrier top side; mounting an integrated circuit over the carrier top side; attaching a bottom attachment directly on the integrated circuit; dragging a sandwich connector from the bottom attachment, the sandwich connector having a connector diameter; and attaching a top attachment directly on the sandwich connector, the top attachment wider than the bottom attachment.

10 Claims, 4 Drawing Sheets

INTEGRATED CIRCUIT PACKAGING SYSTEM WITH INTERCONNECTS AND METHOD OF MANUFACTURE THEREOF

TECHNICAL FIELD

The present invention relates generally to an integrated circuit packaging system, and more particularly to a system for an integrated circuit packaging system with interconnects.

BACKGROUND ART

In order to connect electrodes of a semiconductor element to external leads, a bonding wire has been conventionally used. When such wire is used for connecting the semiconductor element and a lead frame to each other, such a method has been affected that both components are pressure-bonded through ultrasonic waves, or for the electrodes of the semiconductor element, a hot pressure bonding is affected after each tip thereof has been balled up by arc.

However, it has been recently achieved to make an integrated circuit (IC) smaller in size and to make the degree of integration thereof higher, with the result that there occurs such problem that, due to an increase in number of electrodes, the electrodes have occupied a too large area in the case of a conventional wire diameter. In order to solve this problem, it is necessary to make the diameter of wire small. However, in the case where the now available wire is made small in size, the wire is apt to rupture to high degree during a wiring operation and the use thereof. Such wire cannot be used practically.

At the present time, as the bonding wire for bonding an electrode on a semiconductor device and an external terminal, a thin wire (bonding wire) is mainly being used. For bonding a bonding wire, the ultrasonic bonding/thermal compression bonding method is the most general. A general purpose bonding machine and a capillary jig through which the wire is passed for connection are used. The tip of the wire is heated to melt by arc heat input, the surface tension is used to form a ball, then this ball part is pressed against an electrode of the semiconductor device heated in range for bonding, then the wire is directly bonded to the external lead side by ultrasonic bonding.

These wire bonding techniques are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Thus, a need still remains for an integrated circuit packaging system providing reliability and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package carrier having a carrier top side; mounting an integrated circuit over the carrier top side; attaching a bottom attachment directly on the integrated circuit; dragging a sandwich connector from the bottom attachment, the sandwich connector having a connector diameter; and attaching a top attachment directly on the sandwich connector, the top attachment wider than the bottom attachment.

The present invention provides an integrated circuit packaging system, including: a package carrier having a carrier top side; an integrated circuit over the carrier top side; a bottom attachment directly on the integrated circuit; a sandwich connector coupled to the bottom attachment, the sandwich connector having a connector diameter; and a top attachment directly on the sandwich connector, the top attachment wider than the bottom attachment.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
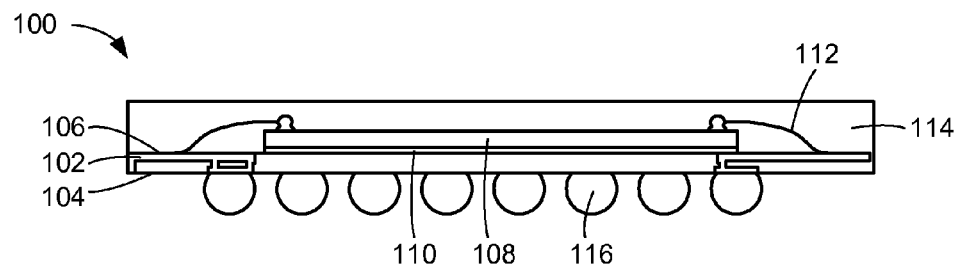
FIG. 1 is a cross-sectional view of an integrated circuit packaging system taken along line 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

To reduce package (PKG) height, thin die, thin printed circuit board (PCB), and lower loop profile can be applied. Ultra-low loop can be one of loop profiles. Ultra-low loop has weaker ball neck strength than that of a normal loop because of additional ball neck stress during looping process. Special PKG structure with thin die, thin PCB, thin wire, and ultra-low loop cannot be easy to control wire bonding quality because of ball neck broken and loop deformation during PCB handling process. This problem causes assembly yield loss. Embodiments of the present invention provide answers or solutions to the problem.

Figure 2:
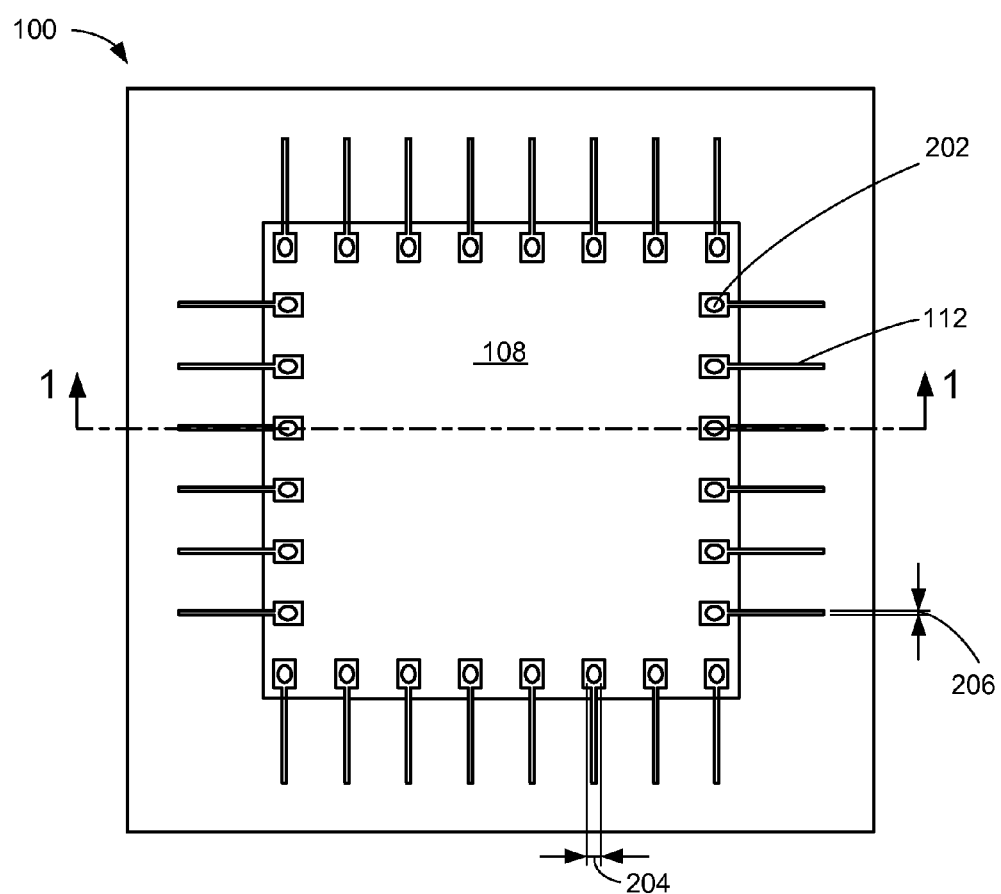
FIG. 2 is a top plan view of the integrated circuit packaging system.

Referring now to FIG. 1, therein is shown a cross-sectional view of an integrated circuit packaging system 100 taken along line 1-1 of FIG. 2 in an embodiment of the present invention. The integrated circuit packaging system 100 can include a sandwich wire bonding method for ball neck broken (BNB) improvement.

The integrated circuit packaging system 100 can include a fine pitch ball grid array with 3 die stack package-on-package top (TFBGA-SD3 POPt) package. The integrated circuit packaging system 100 can include an attach adhesive, wires with metallic material including gold, capillary, a wire bonder for forward and sandwich bonding.

The integrated circuit packaging system 100 can include a package carrier 102 having a carrier bottom side 104 and a carrier top side 106 opposite the carrier bottom side 104. The package carrier 102 provides a support structure for mounting or attaching a semiconductor device thereto. The package carrier 102 can include a number of conductive layers providing electrical connectivity between the carrier bottom side 104 and the carrier top side 106.

The integrated circuit packaging system 100 can include an integrated circuit 108 mounted over the carrier top side 106. The integrated circuit packaging system 100 can include an adhesive layer 110 attached to the carrier top side 106 and the integrated circuit 108.

The integrated circuit packaging system 100 can include sandwich connectors 112 electrically connected or attached to the package carrier 102 and pads of a die, such as the integrated circuit 108. The sandwich connectors 112 are formed with robust attachment to the integrated circuit 108 with balls or bumps attached to bottom and top extents of the sandwich connectors 112. The sandwich connectors 112 will be subsequently described in more details. For example, the sandwich connectors 112 can include bond wires.

The integrated circuit packaging system 100 can include an encapsulation 114 over a top extent of the package carrier 102, the integrated circuit 108, the adhesive layer 110, and the sandwich connectors 112. The integrated circuit packaging system 100 can include external interconnects 116 attached to a bottom extent of the package carrier 102. The external interconnects 116 are electrical connectors that provide electrical connectivity between the package carrier 102 and an external system (not shown).

Referring now to FIG. 2, therein is shown a top plan view of the integrated circuit packaging system 100. The top plan view depicts the integrated circuit packaging system 100 without the encapsulation 114 of FIG. 1.

The sandwich connectors 112 can be formed along peripheral sides of the integrated circuit 108. The integrated circuit packaging system 100 can include a top attachment 202 to provide a firm joint between the integrated circuit 108 and an end portion of one of the sandwich connectors 112.

The top attachment 202 can include a top attachment width 204 greater than connector diameters 206 of the sandwich connectors 112. The top attachment width 204 is a distance between opposite sides of the top attachment 202. The top attachment width 204 is measured in a direction approximately perpendicular to a longest side of one of the sandwich connectors 112.

It has been discovered that the top attachment 202 having the top attachment width 204 greater than the connector diameters 206 provides improved package reliability as well as assembly yield improvement, wire bonding quality improvement with high ball pull test (BPT) and ball shear test (BST), and manufacturing cost saving from wire diameter reduction.

Figure 3:
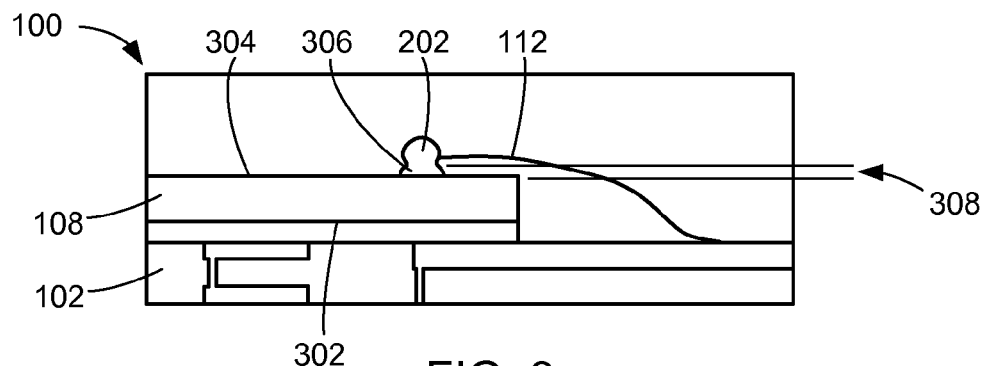
FIG. 3 is a detailed view of a portion of the integrated circuit packaging system.

Referring now to FIG. 3, therein is shown a detailed view of a portion of the integrated circuit packaging system 100. The detailed view depicts the package carrier 102 connected to the integrated circuit 108 with one of the sandwich connectors 112.

The integrated circuit 108 can include an inactive side 302 and an active side 304 opposite the inactive side 302. The inactive side 302 can be mounted over or attached to the package carrier 102. The active side 304 includes active circuitry fabricated thereon.

The sandwich connectors 112 can be formed with a sandwich bonding process. The sandwich bonding process can include ball bonding to form a bottom attachment 306 directly on the active side 304. The bottom attachment 306 provides a firm joint between the active side 304 and an end portion of one of the sandwich connectors 112. A portion of each of the sandwich connectors 112 can be approximately parallel to and above the active side 304.

The sandwich bonding process can include looping to form the sandwich connectors 112 with ultra-low loops. An end portion of one of the sandwich connectors 112 can be connected or attached to or directly on the bottom attachment 306.

The sandwich bonding process can include stitch bond to connect or attach another end portion of one of the sandwich connectors 112 to the package carrier 102. The sandwich bonding process can include bump bond as an additional bond to form the top attachment 202 over a bonded ball, such as the bottom attachment 306. An additional bump bond on the bonded ball after the stitch bond provides an improvement method. For example, the sandwich bonding process can include a stud bump.

The top attachment 202 can be wider than the bottom attachment 306. The top attachment width 204 of FIG. 2 can be greater than a width of the bottom attachment 306. The top attachment 202 can cover and extend beyond a top portion of the bottom attachment 306.

A portion of the top attachment 202 can be directly on one of the sandwich connectors 112. Another portion of the top attachment 202, which is not directly on one of the sandwich connectors 112, can be directly on a portion of the bottom attachment 306.

For example, a ball pull test (BPT) result value of a sandwich bond can be approximately 51.5% better than that of a conventional ultra-low loop bond. Also for example, a ball shear test (BST) result value of a sandwich bond can be approximately 20% better than that of a conventional ultra-low loop bond.

The bottom attachment 306 can include a bottom attachment height 308 greater than the connector diameters 206 of FIG. 2. The bottom attachment height 308 is a distance between a contact pad of the integrated circuit 108 at the active side 304 and a top extent of the bottom attachment 306.

The integrated circuit packaging system 100 can include a finished height of the whole connection. The finished height is a distance from a contact pad of the integrated circuit 108 at the active side 304 to a top extent of the top attachment 202. The finished height is a height of whole connection of the bottom attachment 306, one of the sandwich connectors 112, and the top attachment 202.

The bottom attachment height 308 can include an approximate range of 6.25 micrometers (um) to 17.5 micrometers (um). The finished height can include an approximate range of 12.5 micrometers (um) to 35.0 micrometers (um).

It has been discovered that the top attachment 202 directly on one of the sandwich connectors 112 eliminates a ball neck broken (BNB) problem with sandwich bonding based on an evaluation using printed circuit board (PCB) bending tests thereby providing robust bonding process window as well as package design flexibility for loop height and wire length.

Figure 4:
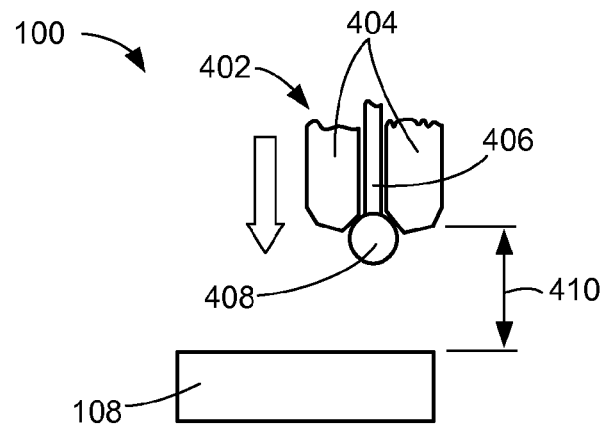
FIG. 4 is a cross-sectional view of the integrated circuit packaging system in a preparation phase of manufacture.

Referring now to FIG. 4, therein is shown a cross-sectional view of the integrated circuit packaging system 100 in a preparation phase of manufacture. The integrated circuit packaging system 100 can include a wire bonder 402 having a capillary 404 to form electrical interconnections attached to the integrated circuit 108.

A conductive wire 406 can be fed through the capillary 404. An electric charge or heat can be applied to melt the conductive wire 406 at a tip of the capillary 404. A tip of the conductive wire 406 can be formed into a conductive ball 408 because of a surface tension of a molten metal. The conductive ball 408 can be formed with the capillary 404 going down to make a compressed motion.

A tip of the capillary 404 can be at a tip height 410 above the integrated circuit 108. The tip height 410 is a distance between the integrated circuit 108 and the tip of the capillary 404. The capillary 404 can be moved downwardly towards the integrated circuit 108 at a constant velocity (C/V).

Figure 5:
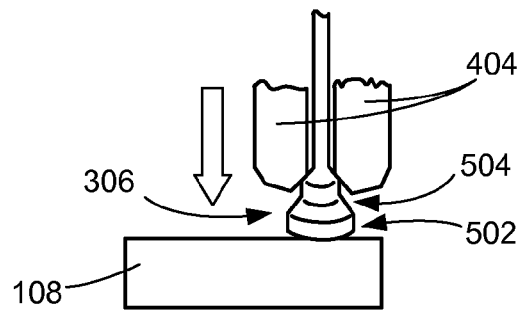
FIG. 5 is the structure of FIG. 4 in a first compression phase.

Referring now to FIG. 5, therein is shown the structure of FIG. 4 in a first compression phase. After a bonded ball, such as the conductive ball 408 of FIG. 4, is formed, the capillary 404 can be moved downwardly to perform in a first compressed motion. The capillary 404 can be moved downwardly towards the integrated circuit 108 such that the conductive ball 408 can be in contact with the integrated circuit 108.

The conductive ball 408 can be compressed and deformed to form the bottom attachment 306. The bottom attachment 306 can include a lower attachment portion 502 and an upper attachment portion 504 over the lower attachment portion 502. The lower attachment portion 502 can include a width greater than a width of the upper attachment portion 504.

Figure 6:
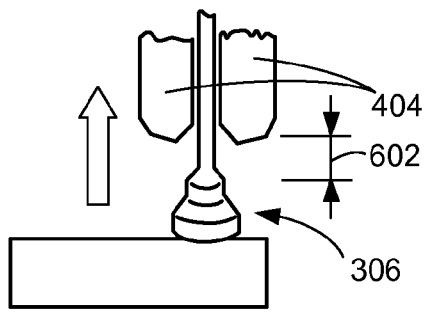
FIG. 6 is the structure of FIG. 5 in a first drawing phase.

Referring now to FIG. 6, therein is shown the structure of FIG. 5 in a first drawing phase. The capillary 404 can be drawn upwardly and away from the bottom attachment 306 in a process of forming one of the sandwich connectors 112 of FIG. 1. One of the sandwich connectors 112 can be dragged from and coupled to the bottom attachment 306.

The capillary 404 can be upwardly drawn such that the tip of the capillary 404 can be at a base bond height 602 above the bottom attachment 306. The base bond height 602 can preferably include an approximate range of 80 micrometers (um) to 90 micrometers (um).

Figure 7:
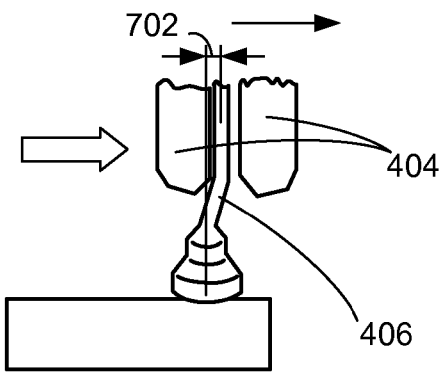
FIG. 7 is the structure of FIG. 6 in a moving phase.

Referring now to FIG. 7, therein is shown the structure of FIG. 6 in a moving phase. The capillary 404 can be laterally moved sideways to a fold XY position, which is at a displacement in a horizontal direction from a previous position as a standard point of the conductive wire 406 in FIG. 6. The conductive wire 406 can be heated while the capillary 404 is moved. The capillary 404 can be moved such that the conductive wire 406 can be at a fold distance 702 horizontally away from the previous position (as shown with a long dash line). The fold distance 702 can preferably include an approximate range of 45 micrometers (um) to 55 micrometers (um).

Figure 8:
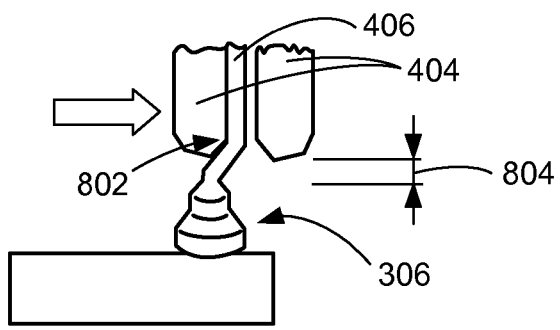
FIG. 8 is the structure of FIG. 7 in a folding phase.

Referring now to FIG. 8, therein is shown the structure of FIG. 7 in a folding phase. The capillary 404 can be continued to horizontally move sideways such that a mark 802 at the conductive wire 406 can be formed with the capillary 404 pressed against or made contact with the conductive wire 406. The mark 802 can include a dent, a depression, or an impression.

The capillary 404 can be at a fold offset 804 above the bottom attachment 306. The fold offset 804 is a distance between the bottom attachment 306 and the tip of the capillary 404. The fold offset 804 is measured from a bonding tip edge, such as the tip of the capillary 404, to a ball neck, such as a top extent or a top portion of the bottom attachment 306. A fold Z offset, such as the fold offset 804, can preferably include an approximate range of −40 micrometers (um) to −50 micrometers (um).

Figure 9:
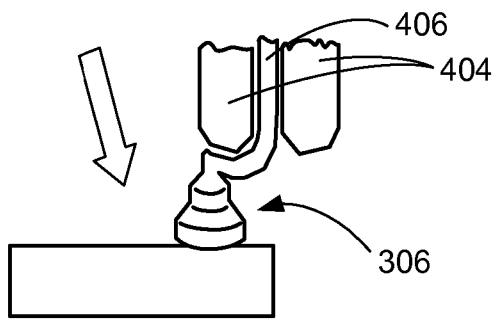
FIG. 9 is the structure of FIG. 8 in a second compression phase.

Referring now to FIG. 9, therein is shown the structure of FIG. 8 in a second compression phase. The capillary 404 can continuously move downwardly again to perform the fold Z offset. The conductive wire 406 can be heated while the capillary 404 is moved. The capillary 404 can be in contact with or pressed against the conductive wire 406 to form a mark at or near a portion of the conductive wire 406 above the bottom attachment 306.

Figure 10:
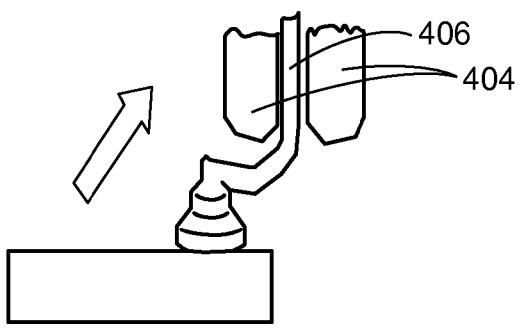
FIG. 10 is the structure of FIG. 9 in a second drawing phase.

Referring now to FIG. 10, therein is shown the structure of FIG. 9 in a second drawing phase. The capillary 404 can be drawn upwardly to end the compressed motion in FIG. 9 to perform the next parameter. The capillary 404 can be drawn upwardly so that the conductive wire 406 can be subsequently attached to the package carrier 102 of FIG. 1 to form one of the sandwich connectors 112 of FIG. 1.

Figure 11:
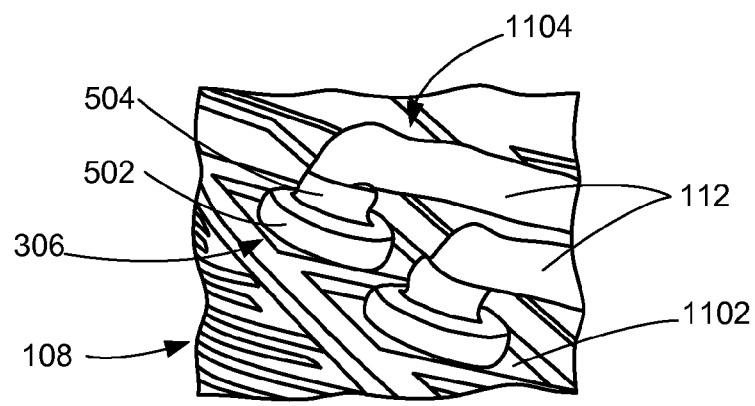
FIG. 11 is an isometric view of the sandwich connectors.

Referring now to FIG. 11, therein is shown an isometric view of the sandwich connectors 112. The isometric view depicts the bottom attachment 306 attached to a contact 1102 of the integrated circuit 108. One of the sandwich connectors 112 can be attached to the bottom attachment 306.

A plane of a vertical extent (e.g. bottom or top) of one of the sandwich connectors 112 can be approximately perpendicular to a plane of a horizontal extent of the bottom attachment 306 characteristic of the capillary 404 of FIG. 9 in contact with or pressed against the conductive wire 406 of FIG. 9. This constitutes one of the sandwich connectors 112 at approximately a 90-degree bent from or within a height of the bottom attachment 306.

The lower attachment portion 502 can be attached to the integrated circuit 108. The upper attachment portion 504 can be attached to one of the sandwich connectors 112.

Each of the sandwich connectors 112 can include an indentation 1104 at a portion of each of the sandwich connectors 112 that is above the bottom attachment 306. The indentation 1104 can be formed in the second compression phase characteristic of the capillary 404 in contact with or pressed against the conductive wire 406.

For illustrative purposes, the top attachment 202 of FIG. 2 is not shown, although the isometric view can include the top attachment 202. The top attachment 202 provides a firm joint between the integrated circuit 108 and an end portion of one of the sandwich connectors 112.

Figure 12:
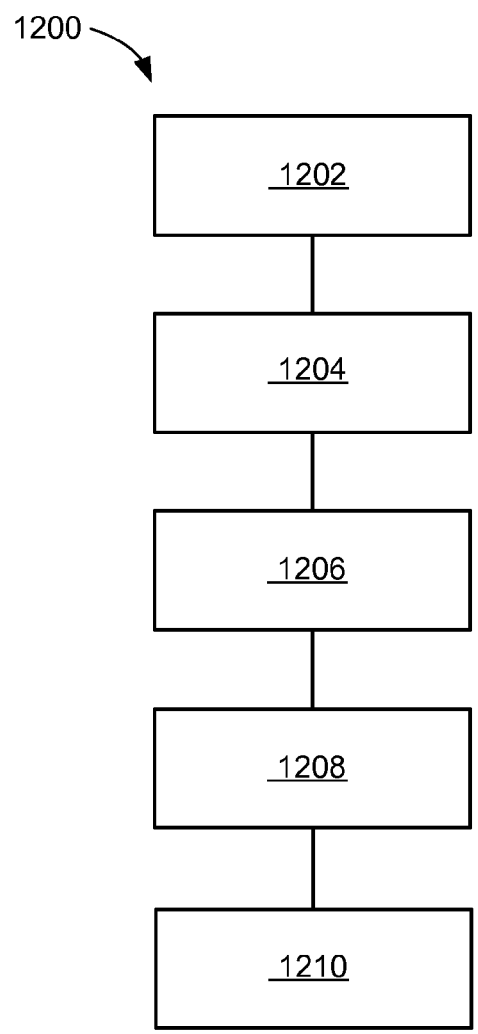
FIG. 12 is a flow chart of a method of manufacture of the integrated circuit packaging system in a further embodiment of the present invention.

Referring now to FIG. 12, therein is shown a flow chart of a method 1200 of manufacture of the integrated circuit packaging system 100 in a further embodiment of the present invention. The method 1200 includes: providing a package carrier having a carrier top side in a block 1202; mounting an integrated circuit over the carrier top side in a block 1204; attaching a bottom attachment directly on the integrated circuit in a block 1206; dragging a sandwich connector from the bottom attachment, the sandwich connector having a connector diameter in a block 1208; and attaching a top attachment directly on the sandwich connector, the top attachment wider than the bottom attachment in a block 1210.

Thus, it has been discovered that the integrated circuit packaging system of the present invention furnishes important and heretofore unknown and unavailable solutions, capabilities, and functional aspects for an integrated circuit packaging system with interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package carrier having a carrier top side;
   mounting an integrated circuit over the carrier top side;
   attaching a ball-shaped bottom attachment having a pre-determined diameter and a height as measured from a top surface of a contact pad of the integrated circuit, directly on the integrated circuit;
   attaching a first end of a sandwich connector to the bottom attachment, the sandwich connector having a connector diameter and an indentation, wherein the connector diameter is smaller than the bottom attachment height, and wherein the indentation is above and off-center from the bottom attachment;
   attaching a second end of the sandwich connector to the carrier top side; and
   attaching a top attachment directly on the first end of the sandwich connector and over the bottom attachment, the top attachment wider than the connector diameter and the diameter of the bottom attachment, and wherein the top attachment and the bottom attachment have the same central axis in both x and y directions as seen in a plan view.

2. The method as claimed in claim 1 wherein attaching the first end of the sandwich connector to the bottom attachment includes attaching the sandwich connector along a peripheral side of the integrated circuit.

3. The method as claimed in claim 1 further comprising forming an encapsulation over the top attachment and the sandwich connector.

4. The method as claimed in claim 1 wherein attaching the first end of the sandwich connector to the bottom attachment includes attaching the sandwich connector approximately perpendicular to the bottom attachment and approximately parallel to an active side of the integrated circuit.

5. An integrated circuit packaging system comprising:
   a package carrier having a carrier top side;
   an integrated circuit over the carrier top side;
   a ball-shaped bottom attachment having a pre-determined diameter and a height as measured from a top surface of a contact pad of the integrated circuit, directly on the integrated circuit;
   a sandwich connector attached to the bottom attachment, the sandwich connector having a connector diameter and an indentation, wherein the connector diameter is smaller than the bottom attachment height, and wherein the indentation is above and off-center from the bottom attachment; and
   a top attachment directly on an end portion of the sandwich connector and over the bottom attachment, the top attachment wider than the connector diameter and the diameter of the bottom attachment, and wherein the top attachment and the bottom attachment have the same central axis in both x and y directions as seen in a plan view.

6. The system as claimed in claim 5 wherein the sandwich connector is approximately perpendicular to the bottom attachment.

7. The system as claimed in claim 5 wherein the sandwich connector includes the sandwich connector attached to the carrier top side.

8. The system as claimed in claim 7 wherein the sandwich connector is along a peripheral side of the integrated circuit.

9. The system as claimed in claim 7 further comprising an encapsulation over the top attachment and the sandwich connector.

10. The system as claimed in claim 7 wherein the sandwich connector is approximately parallel to an active side of the integrated circuit.

* * * * *